United States Patent
Sato et al.

[11] Patent Number: 5,916,714
[45] Date of Patent: Jun. 29, 1999

[54] PREPARATION OF A PIXEL SHEET PROVIDED WITH BLACK MATRIX

[75] Inventors: Morimasa Sato; Sadao Fujikura; Masayuki Iwasaki, all of Shizuoka, Japan

[73] Assignee: Fuji Photo Film Co., Ltd., Kanagawa, Japan

[21] Appl. No.: 08/898,498

[22] Filed: Jul. 22, 1997

[30] Foreign Application Priority Data

Jul. 23, 1996 [JP] Japan ................................. 8-211998

[51] Int. Cl.$^6$ ........................... G02B 5/20; G02F 1/1335
[52] U.S. Cl. ................................................ 430/7; 430/321
[58] Field of Search ....................... 430/7, 321; 349/110

[56] References Cited

U.S. PATENT DOCUMENTS 5,503,952  4/1996  Suzuki et al. ................................. 430/7

FOREIGN PATENT DOCUMENTS 1-145626  6/1989  Japan .
2-277005  11/1990  Japan .
8-314131  11/1996  Japan .

*Primary Examiner*—John A. McPherson
*Attorney, Agent, or Firm*—Sixbey, Friedman, Leedom & Ferguson, P.C.; Gerald J. Ferguson, Jr.; Jeffrey L. Costellia

[57] ABSTRACT

A pixel sheet provided with black matrix is prepared by the steps of: preparing a pixel sheet by forming pixels on a light-transmissive support under the condition that a space area is left between the pixels; covering the pixels and the space area of the pixel sheet with a photosensitive black resin layer; exposing to light the pixel sheet having the black resin layer on the side of the support; bringing the light-exposed pixel sheet in contact with a developing solution to peel the black resin layer on the pixels off, while keeping the black resin layer on the support in the space area; and heating the developed pixel sheet so that the black resin layer in the space area is fully cured.

4 Claims, 2 Drawing Sheets

Fig. 1-a
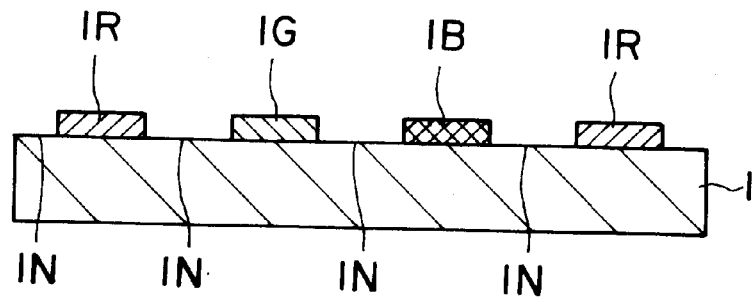
Fig. 1-b
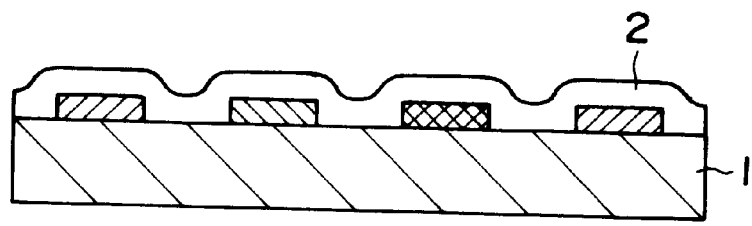
Fig. 1-c
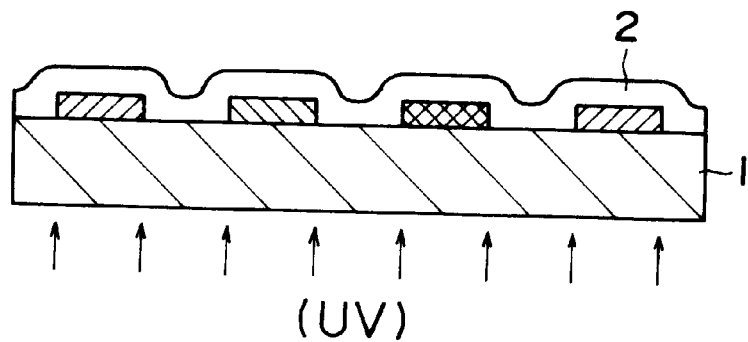

Fig. 1-d
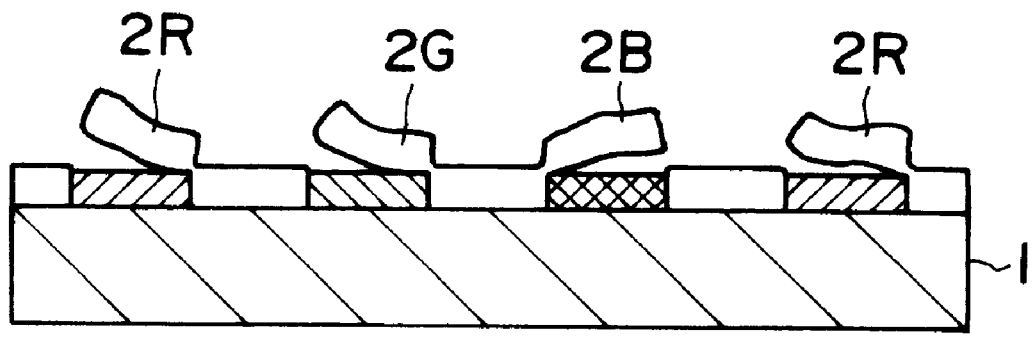
Fig. 1-e
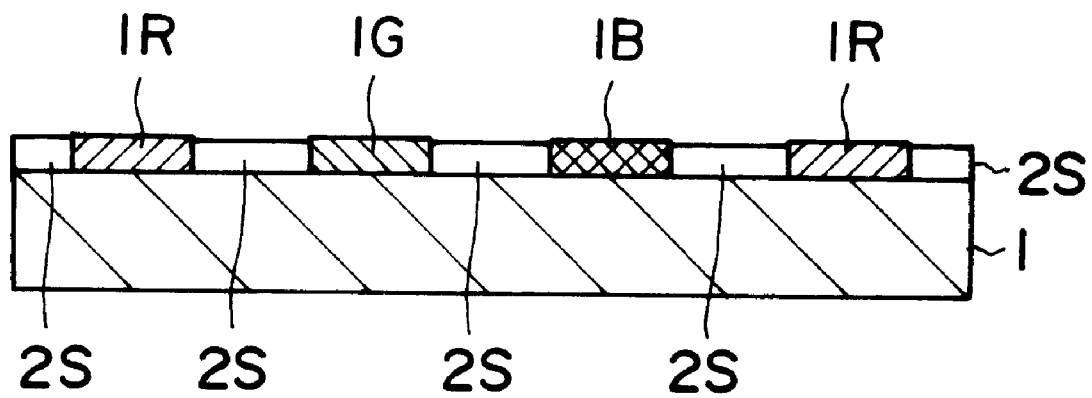

PREPARATION OF A PIXEL SHEET PROVIDED WITH BLACK MATRIX

FIELD OF THE INVENTION

The present invention relates to a process for the preparation of a pixel sheet provided with black matrix having a high optical density, and relates to a photosensitive colored resin composition employable for the process. Particularly, the invention relate to the process according to a self-alignment exposing system which is favorably employable for the preparation of a color filter employed in the preparation of a color liquid crystal display device.

BACKGROUND OF THE INVENTION

A color filter employed for a color liquid crystal display device usually comprises red, green and blue pixels formed on a light-transmissive support (e.g., glass plate) and a black matrix provided on a space area (gap area) between the pixels to improve contrast of a displayed image. The color filter is, for example, prepared by forming a black matrix in the form of net and forming the red, green and blue pixels in order on the space area of the black matrix utilizing photolitho method.

The black matrix is, for example, formed by known methods of employing a layer of metal such as chromium, and utilizing a photosensitive resin containing shading pigments dispersed therein. The method employing the metal layer comprises the steps of forming a metal layer on a support by depositing, and forming a photoresist layer, exposing imagewise the layer to light and developing the exposed layer (i.e., photolitho method), and further etching an exposed area of the metal layer. The method using photosensitive resin containing a shading pigment comprises the steps of forming a photosensitive resin layer containing a shading pigment by means of coating or printing, pattern-wise exposing the layer to light and developing the exposed layer.

Japanese Patent Provisional Publication No. 62(1987)-9301 discloses a process for preparing a black matrix by a self-alignment exposing system (self-register system) using a photosensitive black resin containing a shading pigment dispersed therein. The self-alignment exposing system attracts considerable attention from the standpoint of workability and economical efficiency. The process comprises the steps of forming a photosensitive black resin layer containing a shading pigment (e.g., carbon black) dispersed therein on a support provided with red, green and blue pixels, and exposing to light the photosensitive black resin layer on the back side of the support so that the pixels serve as a photomask.

In more detail, the red, green and blue pixels are formed by coating a coating solution containing a polyimide precursor for forming each of the pixels on a support; the formed layer is exposed to light and developed to form color pattern (pixels); and on the color pattern, a layer of casein wherein photosensitivity is given by ammonium dichromate is formed by coating; and then the layer is exposed to light from the back side by using the color pattern as a photomask and developed, to prepare a black matrix. The self-alignment exposing system brings about an advantage of requiring no register step, which is usually needed for forming a black matrix, and further of scarcely producing a small image-lacking portion because the photosensitive casein layer for forming a black matrix is formed so as to completely cover the gap area (space area) between the pixels.

Japanese Patent Provisional Publication No. 7(1995)-28236 discloses an image forming method wherein transmittance of visible radiation and that of ultraviolet radiation of a photosensitive black resin layer containing a shading pigment are controlled in the range of 1:20 to 0:1, whereby a black matrix formed of the photosensitive black resin layer has a high optical density.

In the self-alignment exposing system, the photosensitive black resin layer containing a shading pigment, which has been exposed to light on the back side of the support, is not sufficiently cured, as described in the above Publication. In more detail, a black pigment (e.g., carbon black) used as a shading pigment greatly adsorbs light of the wavelength region where the photosensitive black resin layer shows photosensitivity, and therefore light incident upon the back side of the support does not reach to a upper side (surface side) of the photosensitive black resin layer not to give a sufficient curing condition in the vicinity of the surface. Hence, the exposed portion of the photosensitive black resin layer is locally removed in the vicinity of the upper surface, which results in lowering of the optical density due to decrease of a thickness of the photosensitive black resin layer.

The control of transmittance in a wavelength region where the photosensitive black resin layer shows photosensitivity, described in Japanese Patent Provisional Publication No. 7(1995)-28236 mentioned above, brings about improvement of the curing condition because of increase of transmittance of light for exposure.

However, it is difficult to prepare a black matrix having a high optical density (e.g., not less than 3.0).

SUMMARY OF THE INVENTION

An object of the present invention is to provide a process for the preparation of a pixel sheet provided with black matrix having high optical density utilizing a self-alignment exposing system.

Another object of the present invention is to provide photosensitive colored resin composition employable for a process for the preparation of a pixel sheet provided with black matrix having high optical density utilizing a self-alignment exposing system.

The inventors have been studied to obtain a black matrix having a high optical density utilizing a self-alignment exposing system. In the developing of the exposed photosensitive black resin layer in the self-alignment exposing system, the developing solution is first brought into contact with the surface of the layer to which light for the exposure difficultly reaches, and therefore the surface is apt to dissolve in the developing solution to reduce a thickness of the exposed photosensitive black resin layer (black matrix), whereby the optical density is lowered.

The inventors have further studied based on the above findings to invent a film-removal developing method (i.e., method of peeling unexposed portions of the photosensitive black resin layer off in the developing procedure). In more detail, by reducing solubility of the photosensitive black resin layer to the developing solution, solubility of the upper side of the exposed portions of the photosensitive black resin layer to the developing solution can be reduced and further the unexposed portions (i.e., on the surfaces of the pixels) of the photosensitive black resin layer can be detached from the surface of the pixel in the form of a swelled film. By setting photosensitive black resin layer to satisfy the above both conditions (e.g., by reducing an acid value of alkali-soluble polymer), it is possible to detaching the unexposed portions from the surfaces of the pixels while keeping the upper sides of the exposed portions from dissolving in the developing solution. For example, in the case that a polymer having an acid value of 104 mg•KOH/g as an alkali-soluble polymer of the photosensitive black resin layer is used and the exposed photosensitive black resin layer is developed using a 1% sodium carbonate aqueous solution, as described in Japanese Patent Provisional Publication No. 7(1995)-28236 mentioned above, a black matrix having a high optical density can not be obtained because the surfaces of the exposed portions are dissolved in the solution.

There is provided by the present invention a process for the preparation of a pixel sheet provided with black matrix comprising the steps of:

preparing a pixel sheet by forming, on a light-transmissive support, pixels comprising two or more kinds of minute colored layers having a color different from each other under the condition that a space area is left between the pixels;

covering the pixels and the space area of the pixel sheet with a photosensitive black resin layer comprising a black colorant and a photosensitive resin;

exposing to light the pixel sheet having the black resin layer on the side of the support so that at least a lower side portion of the photosensitive black resin layer in the space area is cured, while the photosensitive black resin layer on the pixels is not cured;

bringing the light-exposed pixel sheet in contact with a developing solution to peel the black resin layer on the pixels off, while keeping the black resin layer on the support in the space area; and heating the developed pixel sheet so that the black resin layer in the space area is fully cured.

Preferred embodiments of the process of the invention are as follows:

1) The process wherein the pixels are composed of red, green and blue pixels.

2) The process wherein the step of covering the pixels and the space area of the pixel sheet with the photosensitive black resin layer is performed by placing on the pixel sheet an independently prepared photosensitive black resin sheet (transfer sheet) comprising a support film and a photosensitive black resin layer under the condition that the photosensitive black resin layer is brought into contact with the pixels and space area, and removing the support film so that the photosensitive black resin layer is retained on the pixel sheet.

3) The process wherein the photosensitive black resin layer comprises an alkali-soluble polymer, a photopolymerizable monomer having an ethylenically unsaturated double bond, a photopolymerization initiator and a black colorant (especially carbon black), wherein the alkali-soluble polymer comprises a polymer having an acid value in the range of 50 to 100 mg•KOH/g and a weight average molecular weight in the range of 1,000 to 300,000.

The process is advantageously performed by using the following photosensitive colored resin composition of the invention:

A photosensitive colored resin composition which comprises an alkali-soluble polymer, a photopolymerizable monomer having an ethylenically unsaturated double bond, a photopolymerization initiator and a colorant, wherein the alkali-soluble polymer comprises a polymer having an acid value in the range of 50 to 100 mg•KOH/g and a weight average molecular weight in the range of 1,000 to 300,000.

Preferred embodiments of the composition of the invention are as follows:

1) The photosensitive colored resin composition wherein the alkali-soluble polymer comprises a polymer having an acid value in the range of 101 to 200 mg•KOH/g and a weight average molecular weight in the range of 1,000 to 300,000 in combination with the polymer having an acid value in the range of 50 to 100 mg•KOH/g and a weight average molecular weight in the range of 1,000 to 300,000 under the condition that the former and the latter are comprised in a weight ratio of 1:4 to 4:1.

2) The photosensitive colored resin composition wherein the colorant comprises a carbon black.

In the process of the invention, the developing step is carried out by bring the light-exposed pixel sheet in contact with a developing solution to peel the black resin layer on the pixels off. The development gives the black matrix (the black resin layer formed on the space area between the pixels) having a desired thickness because the upper portion of the black matrix is scarcely dissolved in the developing solution, whereby a black matrix having a high optical density and image-lacking minute portions can be obtained.

Hence, the process for the preparation is capable of giving a pixel sheet provided with black matrix having high optical density utilizing a self-alignment exposing system.

The photosensitive colored resin composition of the invention is particularly employable for the process.

BRIEF DESCRIPTION OF THE DRAWINGS

FIGS. 1a–1e are sectional views for explaining a process for the preparation of a pixel sheet provided with black matrix according to the present invention.

DETAILED DESCRIPTION OF THE INVENTION

The process for the preparation of a pixel sheet provided with black matrix of the invention and the photosensitive colored resin composition advantageously employable for the process are explained in detail. The pixel sheet is generally referred to as a color filter.

The process for the preparation of a pixel sheet provided with black matrix of the invention, for example, can be performed in the following manner (the steps (1)–(5)). The process is explained referring to FIGS. 1-a, 1-b, 1-c, 1-d and 1-e.

(1) A step of forming on a light-transmissive support 1, red, green and blue pixels comprising minute colored layers (red pixel 1R, green pixel 1G and blue pixel 1B) so as to leave space area (gap area) 1N between the pixels, to prepare a pixel sheet (FIG. 1-a).

The pixels are generally composed of three kinds of minute colored layers having color different from one another as above. The pixels, however, can be composed of two minute colored layers having different color from each other, or four or more minute colored layers.

The light-transmissive support generally is in the form of plate or sheet. Examples of the light-transmissive supports include known glass plates such as a soda-lime glass plate having a silicon dioxide layer thereon, a low thermal expansion glass plate, a glass plate containing no alkali and a silica glass plate, and various plastic films.

The red, green and blue pixels are generally formed on the light-transmissive support by transferring a transfer sheet having a photosensitive red resin layer for forming the red pixel, imagewise exposing and developing the photosensitive red resin layer to form a red pixel; and forming green and blue pixels in the same manner as the formation of the red pixel. Otherwise, the photosensitive colored resin layer for each pixel can be formed by means of a coating method with no use of the transfer sheet.

The red, green and blue pixels can be placed in any arrangement. Examples of the arrangements include a mosaic type arrangement, a triangle type arrangement and a four pixel type arrangement.

(2) A step of covering the surfaces of the pixels (red pixel 1R, green pixel 1G and blue pixel 1B) and the space area 1N of the pixel sheet with a photosensitive black resin layer 2 which comprises a black colorant and a photosensitive resin, whereby the pixel sheet having the photosensitive black resin layer is obtained (FIG. 1-b).

The covering of the photosensitive black resin layer is preferably conducted by placing on the pixel sheet an independently prepared photosensitive black resin sheet (transfer sheet) comprising a support film and a photosensitive black resin layer under the condition that the photosensitive black resin layer is brought into contact with the pixels and space area, and removing the support film so that the photosensitive black resin layer is retained on the pixel sheet. The photosensitive black resin layer formed by the above transferring is suitably employed for the film-removing development of the invention. The photosensitive black resin layer, however, can be formed by a coating method.

(3) A step of exposing to light the pixel sheet having the photosensitive black resin layer on the back side (side having no pixel) of the light-transmissive support 1 to give to the photosensitive black resin layer 2 unexposed portions on the surfaces of the pixels and exposed portions on the space area therebetween, whereby at least an under side of the exposed portions is cured (exposure from back, FIG. 1-c).

The under side of the photosensitive black resin layer is sufficiently cured, and therefore bonding force between the resin layer and the support is greatly increased. The exposure is generally conducted using ultraviolet radiation (UV) as light. However, the kind of used light can be appropriately selected depending on the photosensitivity of the photosensitive black resin layer.

(4) A step of bringing the pixel sheet provided with the photosensitive black resin layer having the unexposed portions and exposed portions in contact with a developing solution to peel the unexposed portions (2R, 2G and 2B) off from the surfaces of the pixels, while keeping the exposed portions of the black resin layer in the space area, whereby the pixel sheet provided with the exposed portions (black matrix) 2S on the space area is obtained (FIG. 1-d).

The reference number 2R indicates the unexposed portions of photosensitive black resin layer on the surface of the red pixel, the reference number 2G indicates the unexposed portions of photosensitive black resin layer on the surface of the green pixel, and the reference number 2B indicates the unexposed portions of photosensitive black resin layer on the surface of the blue pixel.

In the step (4), when the pixel sheet having the exposed portions (black matrix) 2S of photosensitive black resin layer is brought about into contact with the developing solution, the unexposed portions of photosensitive black resin layer (i.e., the layer on the pixels) swell, which results in the reduction of the bonding strength between the unexposed portion of photosensitive black resin layer and the surface on the pixel. Therefore, the unexposed portions (2R, 2G. 2B) of photosensitive black resin layer on the pixels are removed from the surfaces of the pixels with keeping the unexposed portions in the form of solid (generally in the form of film). Thus, the black matrix 2S comprising the exposed portions of the photosensitive black resin layer is formed on the support in the space area between the pixels.

The black matrix 2S swells during the development, and therefore its thickness is generally larger than that of the pixels or nearly equal to it. However, the thickness of the black matrix generally becomes small compared with those of the pixels after the development.

(5) A step of heating the pixel sheet provided with the black matrix so that the black resin layer (black matrix) in the space area is fully cured.

In more detail, the upper side of the black matrix 2S is not sufficiently cured because the light for the exposure does not reach to the upper portions, and therefore does not have a sufficient water resistance. Hence, the pixel sheet is heated (generally at a temperature of 120 to 250° C. for 10 to 300 minutes) to cure the upper side.

In the step (4), by which the process of the invention is characterized, the removal of the unexposed portions of photosensitive black resin layer on the surfaces of the pixels (i.e., development) is performed with keeping the unexposed portions in the form of solid (i.e., performed by peeling the unexposed portion off). The development can be advantageously conducted by using a photosensitive black resin layer formed of the photosensitive colored resin composition of the invention comprising a black colorant and the photosensitive resin composition which contains a polymer having a specific acid value and molecular weight. Also, the development can be advantageously conducted by a specific developing solution in which the alkaline condition is adjusted (e.g., decrease of alkaline property).

The above development of peeling the unexposed portions of the photosensitive black resin layer on the pixels off brings about the black matrix (the black resin layer formed on the space area between the pixels) having a desired thickness because the upper portion of the black matrix in the space area between the pixels is scarcely dissolved in the developing solution, whereby a black matrix 2S having a high optical density can be obtained. In more detail, the removal of the unexposed portions by peeling off, is performed by utilizing the reduction of the bonding strength between the unexposed portions of the resin layer and the surfaces of the pixels due to swelling of the unexposed portions, in contrast with a conventional development performed by dissolving unexposed portions. Therefore, the bonding strength between the exposed portions of the photosensitive black resin layer and the light-transmissive support (the space area) is increased and the exposed portions are not locally removed to retain the whole resin layer containing the upper portions. In the exposure step (3), the upper portions of the photosensitive black resin layer are not sufficiently cured because the light scarcely reaches to the portions, and however the exposed portions of photosensitive black resin layer strongly adhere onto the support so that the upper portions are also not removed. Thus, black matrix 2S of the photosensitive black resin layer having high optical density is obtained.

The resultant black matrix preferably has an optical density of 2.5 to 4.0, especially 3.0 to 4.0. The optical density is defined as Y value in Calorimetric system CIE (i.e., $-\log(Y/100)$).

Materials employed in the process of the invention are described below.

The photosensitive black resin layer is generally formed of a photosensitive colored (black) resin composition comprising an alkali-soluble polymer, a photopolymerizable monomer having an ethylenically unsaturated double bond, a photopolymerization initiator and a black colorant. The photosensitive black resin layer is generally formed of the photosensitive colored resin composition of the invention. The photosensitive colored resin composition of the invention comprises the monomer, the initiator, a colorant and the alkali-soluble polymer comprising a polymer having an acid value in the range of 50 to 100 mg•KOH/g and a weight average molecular weight in the range of 1,000 to 300,000.

Examples of the above alkali-soluble polymers include polymers having a carboxy group at side-chain such as copolymers of methacrylic acid and other monomer (e.g., benzyl (meth)acrylate), copolymers of acrylic acid and other monomer (e.g., benzyl (meth)acrylate), copolymers of itaconic acid and other monomer, copolymers of crotonic acid and other monomer and copolymers of maleic acid and other monomer, and copolymers of maleic acid and other monomer which is partially esterfied, described in U.S. Pat. No. 4,139,391, Japanese Patent Provisional Publications No. 59(1984)-44615, No. 59(1984)-53836 and No. 59(1984)-71048, and Japanese Patent Publications No. 54(1979)-34327, No. 58(1983)-12577 and No. 54(1979)-25957; cellulose derivatives having a carboxy group at side-chain; and adducts of polymers having a hydroxy group with cyclic anhydrides. Especially, preferred are copolymers of benzyl (meth)acrylate and (meth)acrylic acid, and copolymer made of three or more kinds of monomers such as benzyl (meth) acrylate, (meth)acrylic acid and other monomer, which are described in U.S. Pat. No. 4,139,391.

In the process of the invention, as the alkali-soluble polymer, a polymer having an acid value of 50 to 100 mg•KOH/g (especially 60 to 100 mg•KOH/g) and a weight average molecular weight of 1,000 to 300,000 (especially 10,000 to 250,000) is preferably employed. The polymer is preferably selected from the above mentioned alkali-soluble polymers. The alkali-soluble polymer generally contains the specific polymer in the amount of not less than 10 weight %, preferably not less than 20 weight %, especially not less than 30 weight %.

When the acid value of the polymer is less than 50 mg•KOH/g, the developing property in the case of using an alkaline developing solution becomes poor, while when the acid value is more than 100 mg•KOH/g, the optical density of black matrix is reduced. When the weight average molecular weight of the polymer is less than 1,000, the optical density of black matrix is reduced, while the weight average molecular weight of the polymer is more than 300,000, the developing property becomes poor.

Further, the alkali-soluble polymer of the invention preferably comprises the combination of the above polymer having an acid value of 50 to 100 mg•KOH/g and a weight average molecular weight of 1,000 to 300,000, and a polymer having an acid value of 101 to 200 mg•KOH/g (especially 101 to 150 mg•KOH/g) and a weight average molecular weight of 1,000 to 300,000. The former polymer and latter polymer are preferably employed in the ratio of 1:4 to 4:1 (former:latter), by weight.

The composition for forming the photosensitive black resin layer can contain an alkali-insoluble polymer so long as the developing property does not become poor. Examples of the polymers include alcohol-soluble polyamide (e.g., nylon) and epoxy resin.

The polymer is preferably contained in the photosensitive colored resin composition in the range of 10 to 95 weight %, especially 20 to 90 weight %, based on the weight of the total solid of the composition. When the binder polymer is contained in less than 10 weight %, the photosensitive colored (black) resin layer shows high tackiness, while when the binder polymer is contained in more than 95 weight %, the photosensitive colored (black) resin layer shows a low photosensitivity and the resultant image (e.g., black matrix) shows a low strength.

The photosensitive colored resin composition contains a photopolymerization initiator capable of being activated by active rays. Examples of the initiators include vicpolyketaldonyl compounds disclosed in U.S. Patent No. 2,367,660, aciloin ether compounds disclosed in U.S. Pat. No. 2,448,828, aromatic aciloin compounds replaced with α-hydrocarbon disclosed in U.S. Pat. No. 2,722,512, multiring quinone compounds disclosed in U.S. Pat. No. 3,046,127 and No. 2,951,758, a combination of triarylimidazole dimmer and p-aminoketone disclosed in U.S. Pat. No. 3,549,367, benzothiazole compounds and trihalomethyl-s-triazine compounds described in Japanese Patent Publications No. 51(1976)-48516, trihalomethyl-s-triazine compounds described in U.S. Pat. No. 4,239,850 and trihalomethyloxadiazole compounds described in U.S. Pat. No. 4,212,976. Preferred are trihalomethyl-s-triazine compounds, trihalomethyloxadiazole compounds and triarylimidazole dimmer.

The photopolymerization initiator may be either alone or as a mixture of two or more kinds of them. The photopolymerization initiator is preferably contained in the photosensitive colored resin composition in the range of 0.5 to 20 weight % based on the weight of the total solid of the composition, especially in the range of 1 to 15 weight %. When the initiator is contained in less than 0.5 weight %, the photosensitive (black) resin layer shows a low photosensitivity and the resultant image (e.g., black matrix) shows a low strength. Even if the initiator is contained in more than 20 weight %, improvement of these properties is not observed.

The photosensitive colored resin composition contains a photopolymerizable monomer having an ethylenically unsaturated double bond in its molecule. Examples of the photopolymerizable monomers include monomer compounds having a boiling point of 100° C. or higher under atmospheric pressure and at least one ethylenically unsaturated group. Examples of the photopolymerizable monomers include monofunctional acrylates or methacrylates such as polyethylene glycol mono (meth) acrylate, polypropylene glycol mono (meth) acrylate and phenoxyethyl (meth)acrylate; polyfunctional acrylates or methacrylates such as polyethylene glycol di(meth)acrylate, polypropylene glycol di(meth)acrylate, trimethylolethane tri(meth)acrylate, trimethylolpropane tri(meth)acrylate, trimethylolpropane di(meth)acrylate, neopenthyl glycol di(meth)acrylate, pentaerythritol tetra(meth)acrylate, pentaerythritol tri(meth) acrylate, dipentaerythritol hexa(meth)acrylate, dipentaerythritol penta(meth)acrylate, hexanediol di(meth)acrylate, trimethylolpropane tri((meth)acryloyloxypropyl) ether, tri ((meth)acryloyloxyethyl) isocyanurate, tri((meth) acryloyloxyethyl) cyanurate and glycerol tri(meth)acrylate; compounds obtained by adding ethylene oxide or propylene oxide to a polyol such as trimethylolpropane or glycerol and reacting (meth)acrylic acid or (meth)acryloyl chloride with hydorxy groups of the polyol; urethane (meth)acrylates described in Japanese Patent Publications No. 48(1973)-41708 and No. 50(1975)-6034 and Japanese Patent Provisional Publication No. 51(1976)-37193; polyester (meth) acrylates described in Japanese Patent Provisional Publication No. 48(1973)-64183 and Japanese Patent Publications No. 49(1974)-43191 and No. 52(1977)-30490; and epoxy (meth)acrylates of reaction product of epoxy resin and (meth)acrylic acid. Preferred are trimethylolpropane tri(meth)acrylate, pentaerythritol tetra(meth)acrylate, dipentaerythritol hexa(meth)acrylate and dipentaerythritol penta (meth)acrylate.

The photopolymerizable monomer may be either alone or as a mixture of two or more kinds. The photopolymerizable monomer is preferably contained in the photosensitive colored resin composition in the range of 5 to 50 weight % based on the weight of the total solid of the composition, especially in the range of 10 to 40 weight %. When the photopolymerizable monomers is contained in less than 5 weight %, the photosensitive (black) resin layer shows a low photosensitivity and the resultant image (e.g., black matrix) shows a low strength. When the photopolymerizable monomer is contained in more than 50 weight %, the resultant photosensitive resin layer shows tackiness to excess.

The photosensitive colored resin composition contains a colorant. Examples of the colorants include known red, green, blue, yellow, violet, magenta, cyan and black pigments and dyes. Preferred examples of the colorants include Carmine 6B (C.I. 12490), Phthalocyanine green (C.I. 74260), Phthalocyanine blue (C.I. 74160), Mitsbishi carbon black MA-100, Mitsbishi carbon black #40, Perylene black (BASF K0084, K0086), Cyanine black, Lionol yellow #1201 (C.I. 21090), Lionol yellow GRO (C.I. 21090), Shimura fast yellow 8GF(C.I. 21105), Benzidine yellow 4T-564D (C.I. 21095), Shimura fast red 4015 (C.I. 12355), Lionol red 7B4401 (C.I. 15850), Fastogen blue TGR-L (C.I. 74160), Lionol blue SM (C.I. 26150), Victoria pure blue (C.I. 42595), Auramine O (C.I. 41000), Cathilon brilliant flavin (C.I. basic 13), Rhodamine 6GCP (C.I. 45160), Rhodamine B (C.I. 45170), Safranine OK 70:100 (C.I. 50240), Erioglaucine X (C.I. 42080), Fast black HB (C.I. 26150), C.I. Pigment red 97, C.I. Pigment red 122, C.I. Pigment red 149, C.I. Pigment red 168, C.I. Pigment red 177, C.I. Pigment red 180, C.I. Pigment red 192, C.I. Pigment red 215, C.I. Pigment green 7, C.I. Pigment green 36, C.I. Pigment blue 15:1, C.I. Pigment blue 15:4, C.I. Pigment blue 15:6, C.I. Pigment blue 22, C.I. Pigment blue 60, C.I. Pigment blue 64, C.I. Pigment yellow 139, C.I. Pigment yellow 83 and C.I. Pigment violet 23. Further, metallic powder, white pigments and fluorescent pigments can be employed. The colorant may be employed singly or in combination so as to make the color black.

Preferred combinations of the colorants include a combination of a mixture of red and blue pigments in relationship of complementary color each other and a mixture of yellow and violet pigments in relationship of complementary color each other; a combination of the above combination and a black pigment; and a combination of a mixture of blue and violet pigments and a black pigment. The black colorant is preferably prepared utilizing the above combinations. The black pigment preferably is carbon black. The colorant is preferably contained in the photosensitive (black) resin composition or layer in the range of 1 to 50 weight % based on based on the weight of the total solid of the composition.

The photosensitive colored resin composition may contain a thermal polymerization inhibitor. Examples of the thermal polymerization inhibitors include hydroquinone, p-methoxyphenol, di-t-butyl-p-cresol, pyrogallol, t-butylcatechol, benzoqinone, 4,4'-thiobis(3-methyl-6-t-butylphenol), 2,2'-methylenebis(4-methyl-6-t-butylphenol), 2-mercaptobenzeimidazole and phenotiazine.

The photosensitive colored resin composition may contain known additives such as plasticizer, surface active agent and solvent, if necessary.

The photosensitive colored resin composition of the invention can be obtained, for example, by dispersing the colorant in the polymer binder and further adding other materials into the dispersing mixture.

The photosensitive transfer material preferably employed for forming the photosensitive black resin layer in the process of the invention can be prepared by forming the photosensitive black resin layer on a support film. (temporary substrate). The photosensitive black resin layer is preferably formed of the photosensitive resin composition of the invention.

The photosensitive black resin layer preferably has a thickness of 0.5 to 3 μm. When the thickness is less than 0.5 μm, the pigment content in the layer is needed to be increased to maintain a high optical density and therefore the increase of pigment content brings about poor developing property. The thickness of more than 3 μm brings about poor developing property and poor reproductivity of an image (i.e., black matrix). For example, in the color filter having a black matrix obtained using the photosensitive black resin layer, the surface of the color filter is required to be highly even, i.e., the black matrix is desired not to have projection. Thus, the black matrix is preferably set to have the thickness equal to or less than that of the pixels.

The photosensitive black resin layer is, for example, formed by coating a coating solution prepared through dissolving the above photosensitive colored resin composition in an appropriate solvent on the support film, and drying the coated layer. Examples of known coaters employable for the coating include a spinner, a whirler, a roller coater, a curtain coater, a knife coater, a wire-bar coater and an extruder.

Examples of the solvents include methyl ethyl ketone, propylene glycol monomethyl ether, propylene glycol monomethyl ether acetate, cyclohexanone, cyclohexanol, methyl lactate, ethyl lactate and ε-caprolactam.

In the step (2) of the process of the invention, which is previously described, the covering the surfaces of the pixels (1R, 1G, 1B) and the space area 1N of the pixel sheet with a photosensitive black resin layer 2 is preferably carried out using the above photosensitive transfer sheet (prepared by forming the photosensitive black resin layer on the temporary substrate). In the process of the invention, transfer materials described in Japanese Patent Provisional Publications No. 4(1992)-208940, No. 5(1993)-72724, No. 5(1993)-80503 and No. 5(1993)-173320 can be also employed instead of the above photosensitive transfer sheet.

The above photosensitive transfer sheet prepared by forming the photosensitive black resin layer on the temporary substrate preferably have an alkali-soluble thermoplastic resin layer and an intermediate layer between the support film and photosensitive black resin layer.

The support film preferably have a good releasable property from the alkali-soluble thermoplastic resin layer and chemical and thermal stability, and further comprises a flexible material.

Examples of the support films include thin films such as a Teflon film, a polyethylene terephthalate (PET) film, a polycarbonate film, a polyethylene film and a polypropylene film; and composite thereof. To obtain the good releasability, it is preferred that the substrate is not subjected to a surface treatment and not provided with a subbing layer such as a gelatin layer. The thickness of the substrate is preferred in the range of 5 to 300 μm, especially 20 to 150 μm.

Resin material employable in the alkali-soluble thermoplastic resin layer preferably have a softening point of not higher than 80° C. Example of the materials include a saponification product of ethylene/acrylic ester copolymer, a saponification product of styrene/(meth)acrylic ester copolymer, a saponification product of vinyl toluene/(meth) acrylic ester copolymer, a saponification product of poly (meth)acrylic ester, and a saponification product of copolymer formed of monomers such as (meth)acrylate and vinyl acetate. Further, alkali-soluble organic polymers selected from those having a softening point of not higher than 80° C. described in "Plastic Seino Binran (Plastic Performance Handbook)" edited by Japan Plastic Industry Association and All Japan Federation of Plastics Molding Industry, published by Industrial Investigation Commission (Oct. 25, 1968) can be employed.

Otherwise, it is possible to use alkali-soluble organic polymers having a softening point of higher than 80° C. by combining the polymers with various plasticizers compatible with them to lower the softening point to a temperature of no higher than 80° C. Further, in order to control adhesion to the temporary substrate, the organic polymers may contain various other polymers, supercooling substances, adhesion improving agents, surface active agents, mold-releasing agents, etc., so long as the softening temperature does not substantially exceed 80° C. Examples of preferred plasticizers include polypropylene glycol, polyethylene glycol, dioctyl phthalate, diheptyl phthalate, dibutyl phthalate, tricresyl phosphate, cresyl diphenyl phosphate and biphenyl diphenyl phosphate.

The alkali-soluble thermoplastic resin layer preferably has a thickness of not less than 6 $\mu$m. When the thickness is less than 6 $\mu$m, the resin layer scarcely adsorbs unevenness of the substrate of more than 1 $\mu$m The preferred upper limit of the thickness generally is 100 $\mu$m, especially 50 $\mu$m, from the standpoint of developability and production efficiency.

Known materials can be employed for the intermediate layer so long as they are dispersible or soluble in water or an aqueous alkaline solution and show low oxygen permeability. Examples of the materials include vinyl ether/maleic anhydride copolymers, water-soluble salts of carboxyalkyl celluloses, water-soluble cellulose ethers, water-soluble salts of carboxyalkylated starches, polyvinyl alcohol, polyvinyl pyrrolidone, various polyacrylamides, various water-soluble polyamides, water-soluble salts of polyacrylic acid, gelatin, polyethylene oxide, water-soluble salts of various starches and analogous thereof, styrene/maleic anhydride copolymer, maleate resin and combination of two or more thereof. These materials are described in Japanese Patent Provisional Publication No. 46(1971)-2121 and Japanese Patent Publication No. 56(1981)-40824.

Of these materials, a combination of polyvinyl alcohol and polyvinyl pyrrolidone is preferred. Polyvinyl alcohol preferably has a degree of saponification of not less than 80%. The intermediate layer preferably contain the polyvinyl pyrrolidone in the range of 1 to 75 weight %, more preferably 1 to 60 weight % and especially 10 to 50 weight %. When the content of polyvinyl pyrrolidone is less than 1 weight %, satisfactory adhesion to the photosensitive resin layer cannot be obtained. When the content exceeds 75 weight %, oxygen barrier property of the intermediate layer becomes insufficient.

A thickness of the intermediate layer preferably is 0.1 to 5 $\mu$m, especially 0.5 to 2 $\mu$m. When the thickness is less than 0.1 $\mu$m, oxygen permeability of the intermediate layer is greatly raised. When the thickness is more than 5 $\mu$m, a time period for development or removal of the intermediate layer is increased. In the process, the photosensitive black resin layer is preferably formed on the intermediate layer.

In the step (3) of the process of the invention, which is previously described, the pixel sheet having the photosensitive black resin layer is exposed to a light from the back side (side having no pixel) of the light-transmissive support (i.e., through the support), whereby the photosensitive black resin layer is exposed.

Light sources employed for the exposure from the back side are selected depending on photosensitivity of employed photosensitive black resin layer. Examples of the light sources include a super high pressure mercury lamp, a xenon lamp, a carbon-arc lamp and an argon laser. Further, a filter, in which transmittance of a light at a wavelength range of not more than 400 nm is in the range of not higher than 2%, can be employed together with the lamp, as described in Japanese Patent Provisional Publication No. 6(1994)-59119. If desired, red, green and blue pixels may be formed so that light transmittances of the pixels at wavelength region wherein the photosensitive black resin layer shows photosensitivity are in the range of not higher than 2%, as described in Japanese Patent Provisional Publication No. 6(1994)-59119.

As a developing solution for development of the exposed photosensitive black resin layer, a dilute aqueous solution of alkali (alkaline substance) is generally employed. The solution may further contain a small amount of an organic solvent miscible with water. Preferred examples of the alkaline substances include alkali metal hydroxides (e.g., sodium hydroxide and potassium hydroxide), alkali metal carbonates (e.g., sodium carbonate and potassium carbonate), alkali metal bicarbonates (e.g., sodium bicarbonate and potassium bicarbonate), alkali metal silicates (e.g., sodium silicate and potassium silicate), alkali metal metasilicates (e.g., sodium metasilicate and potassium metasilicate), triethanolamine, diethanolamine, monoethanolamine, morpholine, tetraalkylammonium hydroxides (e.g., tetramethylammonium hydroxide) and sodium tertialy phosphate. The aqueous alkaline solution preferably contains the alkali in an amount of 0.01 to 30 weight %, and preferably shows pH of 8 to 14.

The process containing the specific developing step (i.e., development in the form solid) according to the invention can be carried out by using the aqueous alkaline solution having relatively low pH, even if the photosensitive colored resin composition of the invention is not employed.

Examples of the solvents miscible with water include methanol, ethanol, 1-propanol, 2-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butyrolactone, dimethylformamide, dimethylacetoamide, hexamehylphosphoric triamide, $\epsilon$-caprolactam, methyl lactate, ethyl lactate and N-methylpyrrolidone. The aqueous alkaline solution preferably contains the solvent in an amount of 0.1 to 30 weight %.

The aqueous alkaline solution (developing solution) can contain known surface active agents. The aqueous alkali solution preferably contains the surface active agents in an amount of 0.01 to 10 weight %.

The developing solution can be employed as liquid for a bath or spraying liquid. Removal of the unexposed portions of the photosensitive black resin layer subjecting to the exposing procedure in the form of solid is preferably carried out by rubbing the surface of the resin layer with a rotating brush or a sponge having good wetting property; or by appropriately controlling a spraying pressure of developing solution during spraying of the developing solution. The developing solution is preferably used at a temperature of room temperature to 40° C. After the developing step, a washing procedure can be carried out.

After the developing step, the step of heating the pixel sheet provided with a black matrix (i.e., light cured black resin layer) is carried out. In more detail, the pixel sheet provided with a black matrix is placed in an electric oven or a dryer, or infrared rays is irradiated on the black matrix using an infrared lamp. A temperature and time period for the heating usually depend upon composition of the photosensitive black resin layer or its thickness. Generally, the black matrix is preferably heated at a temperature of 120 to 250° C. and for a time period of 10 to 300 minutes, so as to have satisfactory solvent-resistance and alkali-resistance.

The present invention is further described by the following Examples and Comparison Examples. The term "part" means "weight part" unless otherwise defined.

EXAMPLE 1

A coating solution having the following composition H1 was coated on a polyethylene terephthalate film (temporary substrate, thickness: 100 µm) and dried to form an alkali-soluble thermoplastic resin layer having a thickness of 20 µm.

[Composition (H-1) of coating solution for forming alkali-soluble thermoplastic resin layer]

| | |
|---|---|
| Methyl methacrylate/2-ethylhexyl acrylate/ benzyl methacrylate/methacrylic acid copolymer (molar ratio of monomers: 55/11.7/4.5/28.8, weight average molecular weight: 80,000) | 15.0 parts |
| BPE-500 (multi-functional acrylate monomer; available from Shin Nakamura Kagaku Co., Ltd.) | 7.0 parts |
| F177P (fluorine containing surface active agent; available from Dainippon Ink & Chemicals Inc.) | 0.3 part |
| Methanol | 30.0 parts |
| Methyl ethyl ketone | 19.0 parts |
| 1-Methoxy-2-propanol | 10.0 parts |

On the alkali-soluble thermoplastic resin layer, a coating solution having the following composition B1 was coated and dried to form an intermediate layer having a thickness of 1.6 µm.

[Composition (B1) of coating solution for forming intermediate layer]

| | |
|---|---|
| Polyvinyl alcohol (saponification degree; 80%, PVA205, available from Curaray Co., Ltd.) | 130 parts |
| Polyvinyl pyrrolidone (PVP K-30, GAF Corporation) | 60 parts |
| Distilled water | 2110 parts |
| Methanol | 1750 parts |

On the intermediate layer of the temporary substrate having the alkali-soluble thermoplastic resin layer and intermediate layer, a coating solution having the following composition 1 was coated and dried to form a photosensitive black resin layer having a thickness of 1.6 µm, and then a covering film of polypropylene (thickness: 12 µm) was laminated on the photosensitive black resin layer, to prepare a photosensitive transfer sheet for forming a photosensitive black resin layer.

[Composition (1) of coating solution for forming photosensitive black resin layer]

| | |
|---|---|
| Benzyl methacrylate/methacrylic acid copolymer (molar ratio of monomers: 70/30, acid value: 104 mg · KOH/g, weight average molecular weight: 30,000) | 21.0 parts |
| 2-Ethylhexyl acrylate/methacrylic acid/methyl methacrylate/benzyl methacrylate copolymer (molar ratio of monomers: 7/15/73/5, acid value: 77 mg · KOH/g, weight average molecular weight: 80,000) | 14.7 parts |
| Dipentaerythritol hexaacrylate monomer | 26.8 parts |
| 2,4-Bis(trichloromethyl)-6-[4-(N,N-diethoxy carbomethyl)-3-bromophenyl]-s-triazine | 1.32 parts |
| Carbon black | 27.0 parts |
| Pigment blue 15:6 | 5.70 parts |
| Pigment violet 23 | 3.57 parts |
| Hydroquinone monomethyl ether | 0.02 part |
| F177P (fluorine containing surface active agent, available from Dainippon Ink & Chemicals Inc.) | 0.09 part |
| Propylene glycol monomethyl ether acetate | 400.0 parts |
| Methanol | 600.0 parts |

An optical density of the resultant photosensitive black resin layer was measured by the use of an Macbeth densitometer to give 3.5. Y value in Calorimetric system CIE of the resin layer was measured by the use of C light source to give 0.01, which corresponds to 4.0 in terms of the optical density.

On a glass plate (light-transmissive support, thickness: 1.1 mm), one (red) of coating solutions having compositions shown in Table 1 was coated in the glass plate, and imagewise exposed and developed to give a red (R) layer (red pixels) having a thickness of 2 µm. Similarly, a green (G) layer (green pixels) and a blue (B) layer (blue pixels) was formed, whereby a pixel sheet was obtained.

TABLE 1

(compositions of coating solutions for forming photosensitive layers for pixels)

| | R layer (parts) | G layer (parts) | B layer (parts) |
|---|---|---|---|
| Benzyl methacrylate/methacrylic acid copolymer (molar ratio = 73/37, viscosity = 0.12) | 60.0 | 60.0 | 60.0 |
| Pentaerythritol tetraacrylate monomer | 43.2 | 43.2 | 43.2 |
| Michler's ketone | 2.4 | 2.4 | 2.4 |
| 2-(o-Chlorophenyl)-4,5-diphenylimidazole dimmer | 2.5 | 2.5 | 2.5 |
| Irgasin red BPT (red) | 5.4 | — | — |
| Sudan blue (blue) | — | 5.2 | — |
| Copper phthalocyanine (green) | — | — | 5.6 |
| Methyl cellosolve acetate | 560.0 | 560.0 | 560.0 |
| Methyl ethyl ketone | 280.0 | 280.0 | 280.0 |

After the cover film of the photosensitive transfer sheet having the photosensitive black resin layer (for black matrix) prepared above, was peeled from the transfer sheet, the transfer sheet was superposed on the resultant pixel sheet having R, G and B pixels so that the photosensitive black resin layer was in contact with the surface of pixel side, and laminated by applications of pressure (0.8 kg/cm$^2$) and heat (130° C.) using a laminator (VP-II, available from Taisei Laminator K.K.). Then, the temporary substrate of the transfer sheet was separated from the pixel sheet, keeping the thermoplastic resin layer, intermediate layer and photosensitive black resin layer on the pixel sheet.

Subsequently, the photosensitive black resin layer was exposed to UV light using a super high pressure mercury lamp on the side of the glass plate, through a glass filter (UVD 36c, available from Tokyo Shibaura Electric Co., Ltd.) which cuts off a light of wavelengths of not less than 400 nm. The exposing was carried out in an exposing amount of 100 mj/cm². Then, the pixel sheet was treated with a treating solution (alkaline aqueous solution TPD, available from Fuji Photo Film Co., Ltd.) to remove the alkali-soluble thermoplastic resin layer (and intermediate layer), and the exposed photosensitive black resin layer was developed using a developing solution (alkaline aqueous solution TCD, available from Fuji Photo Film Co., Ltd.) to remove the unexposed portions of the layer, whereby a black resin layer (black matrix) was formed on a gap area between the pixels. It was observed that removal of the unexposed portions on the pixels was carried out with keeping the unexposed portions in the form of film (i.e., by peeling the unexposed portions off).

The glass plate having the pixels and black matrix was heated at a temperature of 220° C. for 130 minutes to cure portions of upper side of the black resin layer (black matrix) which had been not cured by the exposure of the pixel sheet, whereby a color filter was prepared.

In the resultant color filter, no overlap of the black matrix with pixels was observed, and the black matrix showed Y value of 0.01 (optical density: 4.0) and was observed to have a small thickness compared with that of the pixels and to have uneven surface.

Comparison Example 1

The procedures of Example 1 were repeated except for conducting the formation of the photosensitive black resin layer in the following manner.

On the intermediate layer of the temporary substrate having the alkali-soluble thermoplastic resin layer and intermediate layer prepared in the same manner as in Example 1, a coating solution having the following composition C1 was coated and dried to form a photosensitive black resin layer having a thickness of 2.0 μm.

[Composition (C1) of coating solution for forming photosensitive black resin layer]

| | |
|---|---|
| Benzyl methacrylate/methacrylic acid copolymer (Molar ratio of monomers: 70/30, acid value: 104 mg · KOH/g, weight average molecular weight: 30,000) | 35.7 parts |
| Dipentaerythritol hexaacrylate monomer | 26.8 parts |
| 2,4-Bis(trichloromethyl)-6-[4-(N,N-diethoxy carbomethyl)-3-bromophenyl]-s-triazine | 1.32 parts |
| Carbon black | 27.0 parts |
| Pigment blue 15:6 | 5.70 parts |
| Pigment violet 23 | 3.57 parts |
| Hydroquinone monomethyl ether | 0.02 part |
| F177P (fluorine containing surface active agent, available from Dainippon Ink & Chemicals Inc.) | 0.09 part |
| Propylene glycol monomethyl ether acetate | 400.0 parts |
| Methanol | 600.0 parts |

An optical density of the resultant photosensitive black resin layer was measured by the use of an Macbeth densitometer to give 3.5. Y value in Calorimetric system CIE of the resin layer was measured by the use of C light source to give 0.01.

In the resultant color filter, although no overlap of the black matrix with pixels was observed, the black matrix showed a low optical density (Y value of 0.5 (optical density: 2.3)) due to decrease of thickness during the developing procedure. Further, it was observed that removal of the unexposed portions on the pixels was carried out by dissolving the unexposed portions with the developing solution (i.e., conventional development).

EXAMPLE 2

The procedures of Comparison Example 1 were repeated to prepare a pixel sheet having photosensitive black resin layer. The pixel sheet was subjected to the exposing treatment and treated with the treating solution in the same manner as in Example 1.

The exposed photosensitive black resin layer was developed using the following developing solution D1 instead of a developing solution (alkaline aqueous solution TCD) to remove the unexposed portions of the layer, whereby a black resin layer (black matrix) was formed gaps between the pixels.

[Composition (D1) of developing solution]

| | |
|---|---|
| Triethanol amine | 3 parts |
| Water | 97 parts |

The glass plate having the pixels and black matrix was heated in the same manner as in Example 1, whereby a color filter was prepared.

An optical density of the resultant photosensitive black resin layer was measured by the use of an Macbeth densitometer to give 3.5. Y value in Calorimetric system CIE of the resin layer was measured by the use of C light source to give 0.01.

In the resultant color filter, no overlap of the black matrix with pixels was observed, and the black matrix showed Y value of 0.01 (optical density: 4.0) and the black matrix was observed to have a small thickness compared with that of the pixels and to have uneven surface. It was observed that removal of the unexposed portions on the pixels was carried out with keeping the unexposed portions in the form of film (i.e., solid).

EXAMPLE 3

The procedures of Example 1 were repeated except for conducting the formation of the photosensitive black resin layer in the following manner.

On the intermediate layer of the temporary substrate having the alkali-soluble thermoplastic resin layer and intermediate layer prepared in the same manner as in Example 1, a coating solution having the following composition (2) was coated and dried to form a photosensitive black resin layer having a thickness of 1.6 μm.

[Composition (2) of coating solution for forming photosensitive black resin layer]

| | |
|---|---|
| Benzyl methacrylate/methacrylic acid copolymer (molar ratio of monomers: 70/30, acid value: 104 mg · KOH/g, weight average molecular weight: 30,000) | 21.0 parts |
| 2-Ethylhexyl acrylate/methacrylic acid/methyl methacrylate/benzyl methacrylate copolymer (molar ratio of monomers: 7/15/73/5, acid value: 77 mg · KOH/g, weight average molecular weight: 80,000) | 14.7 parts |
| Dipentaerythritol hexaacrylate monomer | 26.8 parts |
| 2,4-Bis(trichloromethyl)-6-[4-(N,N-diethoxy carbomethyl)-3-bromophenyl]-s-triazine | 1.32 parts |
| Carbon black | 36.3 parts |
| Hydroquinone monomethyl ether | 0.02 part |

| | |
|---|---|
| F177P (fluorine containing surface active agent, available from Dainippon Ink & Chemicals Inc.) | 0.09 part |
| Propylene glycol monomethyl ether acetate | 400.0 parts |
| Methanol | 600.0 parts |

An optical density of the resultant photosensitive black resin layer was measured by the use of an Macbeth densitometer to give 3.5. Y value in Calorimetric system CIE of the resin layer was measured by the use of C light source to give 0.01.

In the resultant color filter, no overlap of the black matrix with pixels was observed, and the black matrix showed Y value of 0.01 (optical density: 4.0) and the black matrix was observed to have a small thickness compared with that of the pixels and to have uneven surface. It was observed that removal of the unexposed portions on the pixels was carried out with keeping the unexposed portions in the form of film (i.e., solid).

EXAMPLE 4

The procedures of Example 1 were repeated except for conducting the formation of the photosensitive black resin layer in the following manner.

On the intermediate layer of the temporary substrate having the alkali-soluble thermoplastic resin layer and intermediate layer prepared in the same manner as in Example 1, a coating solution having the following composition (3) was coated and dried to form a photosensitive black resin layer having a thickness of 1.6 μm.

[(Composition (3) of coating solution for forming photosensitive black resin layer]

| | |
|---|---|
| 2-Ethylhexyl acrylate/methacrylic acid/methyl methacrylate/benzyl methacrylate copolymer (molar ratio of monomers: 7/15/73/5, acid value: 77 mg · KOH/g, weight average molecular weight: 80,000) | 35.7 parts |
| Dipentaerythritol hexaacrylate monomer | 26.8 parts |
| 2,4-Bis(trichloromethyl)-6-[4-(N,N-diethoxy carbomethyl)-3-bromophenyl]-s-triazine | 1.32 parts |
| Carbon black | 27.0 parts |
| Pigment blue 15:6 | 5.70 parts |
| Pigment violet 23 | 3.57 parts |
| Hydroquinone monomethyl ether | 0.02 part |
| F177P (Fluorine containing surface active agent, available from Dainippon Ink & Chemicals Inc.) | 0.09 part |
| Propylene glycol monomethyl ether acetate | 400.0 parts |
| Methanol | 600.0 parts |

An optical density of the resultant photosensitive black resin layer was measured by the use of an Macbeth densitometer to give 3.5. Y value in Calorimetric system CIE of the resin layer was measured by the use of C light source to give 0.01.

In the resultant color filter, no overlap of the black matrix with pixels was observed, and the black matrix showed Y value of 0.01 (optical density: 4.0) and the black matrix was observed to have a small thickness compared with that of the pixels and to have uneven surface. It was observed that removal of the unexposed portions on the pixels was carried out with keeping the unexposed portions in the form of film (i.e., solid).

What is claimed is:

1. A process for the preparation of a pixel sheet provided with black matrix comprising the steps of:

preparing a pixel sheet by forming, on a light-transmissive support, pixels comprising two or more kinds of minute colored layers having a color different from each other under the condition that a space area is left between the pixels;

covering the pixels and the space area of the pixel sheet with a photosensitive black resin layer comprising a black colorant and a photosensitive resin;

exposing to light the pixel sheet having the black resin layer on the side of the support so that at least a lower side portion of the photosensitive black resin layer in the space area is cured, while the photosensitive black resin layer on the pixels are not cured;

bringing the light-exposed pixel sheet into contact with a developing solution to swell and peel the black resin layer on the pixels off in the form of solid film pieces, while keeping the black resin layer on the support in the space area; and heating the developed pixel sheet so that the black resin layer in the space area is fully cured.

2. The process of claim 1, wherein the pixels are composed of red, green and blue pixels.

3. The process of claim 1, wherein the step of covering the pixels and the space area of the pixel sheet with the photosensitive black resin layer is performed by placing on the pixel sheet an independently prepared photosensitive black resin sheet comprising a support film and a photosensitive black resin layer under the condition that the photosensitive black resin layer is brought into contact with the pixels and space area, and removing the support film so that the photosensitive black resin layer is retained on the pixel sheet.

4. The process of claim 1, wherein the photosensitive black resin layer comprises an alkali-soluble polymer, a photopolymerizable monomer having an ethylenically unsaturated double bond, a photopolymerization initiator and a black colorant, wherein the alkali-soluble polymer comprises a polymer having an acid value in the range of 50 to 100 mg•KOH/g and a weight average molecular weight in the range of 1,000 to 300,000.

* * * * *